United States Patent

Gossmann et al.

[19]

[11] Patent Number: 6,054,342

[45] Date of Patent: Apr. 25, 2000

[54] METHOD OF MAKING INTEGRATED CIRCUITS WITH TUB-TIES

[75] Inventors: Hans-Joachim Ludwig Gossmann, Summit; Thi-Hong-Ha Vuong, Berkeley Heights, both of N.J.

[73] Assignee: Lucent Technologies Inc., Murray Hill, N.J.

[21] Appl. No.: 09/339,306

[22] Filed: Jun. 23, 1999

Related U.S. Application Data

[62] Division of application No. 09/085,913, May 28, 1998, Pat. No. 5,949,112.

[51] Int. Cl.[7] .............................................. H01L 21/8238
[52] U.S. Cl. ...................... 438/199; 438/223; 438/224; 438/227; 438/228; 257/369; 257/371
[58] Field of Search .................................. 438/400, 199, 438/223, 224, 227, 228; 257/371, 369

[56] References Cited

U.S. PATENT DOCUMENTS 4,905,073   2/1990   Chen et al. ................................. 357/67
5,571,745   11/1996   Horiuchi .................................... 437/57

OTHER PUBLICATIONS

U. Schwalke et al., *Exitgate*. . . , 27th European Solid–State Research Conference, Stuttgart, Germany, Sep. 22–24, 1996, pp. 317–320.
U. Schwalke et al.,*Advanced Gate–Stack*. . . , 1997 Symposium on VLSI Technology, Jun. 10–12, 1997, Digest of Technical Papers, pp. 71–72.

C. P. Chang et al.,*A Highly Manufacturable*. . . , 1997 IEDM, Dec. 7–19, 1997, Technical Digest., pp. 661–665 (1997).

*Primary Examiner*—Tom Thomas
*Assistant Examiner*—Netri Parekh
*Attorney, Agent, or Firm*—Richard J. Botos

[57] ABSTRACT

An IC comprises a tub of a first conductivity type, at least one transistor embedded in the tub, and a first pair of isolating regions defining therebetween a tub-tie region coupled to the tub. The tub-tie region comprises a cap portion of the first conductivity type and an underlying buried pedestal portion of a second conductivity type. At least a top section of the pedestal portion is surrounded by the cap portion so that a conducting path is formed between the cap portion and the tub. In a CMOS IC tub-ties of this design are provided for both NMOS and PMOS transistors. In a preferred embodiment, the cap portion of each tub-tie comprises a relatively heavily doped central section and more lightly doped peripheral sections, both of the same conductivity type.

In accordance with another aspect of our invention, a reduced-mask-count CMOS IC process includes forming the isolating regions so that each has a protrusion which extends over the surface regions where the peripheral sections of the cap portion are to be formed. Then, a combination of ion implantation energies and concentrations, as well as suitable PR masking, in conjunction with the shape of the isolating regions, enables selective doping of the pedestal portion.

5 Claims, 5 Drawing Sheets

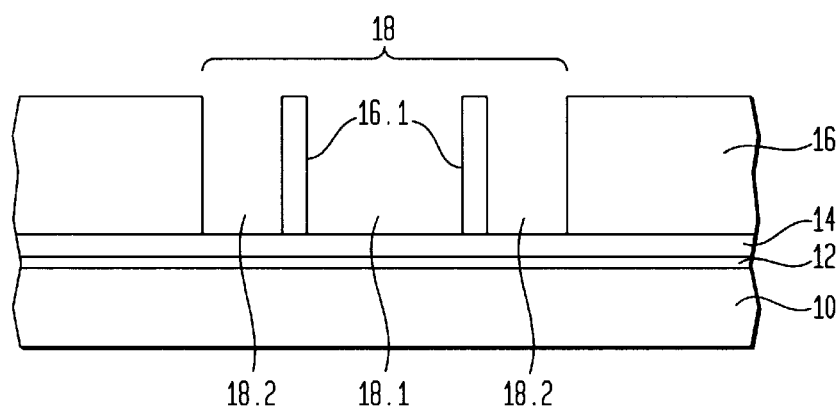
FIG. 1
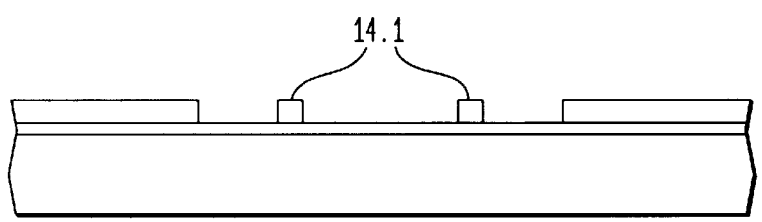
FIG. 2
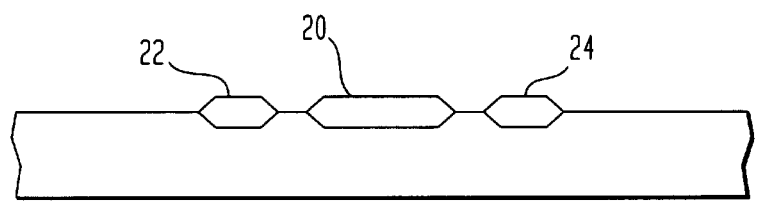
FIG. 3
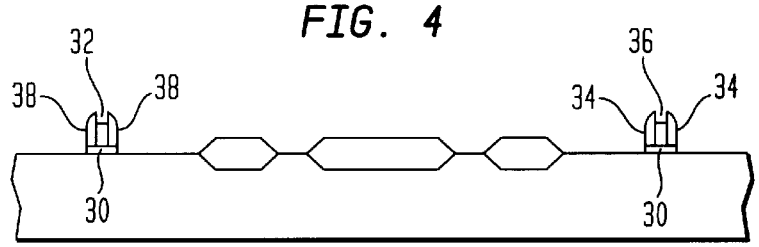
FIG. 4
FIG. 11
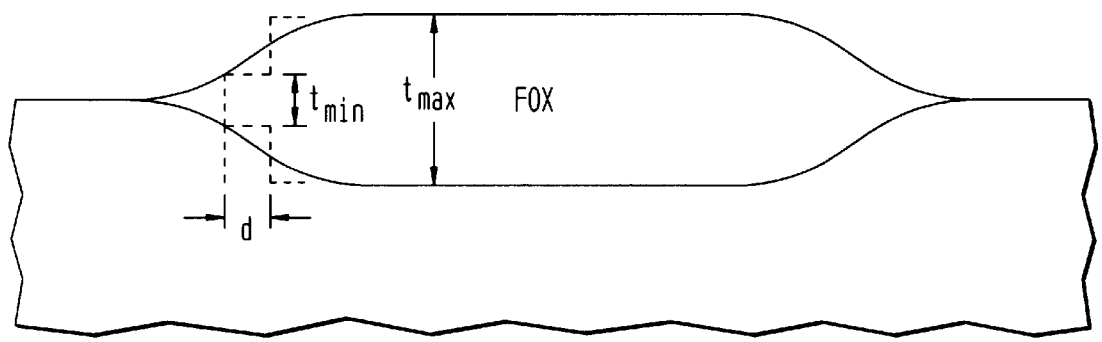

METHOD OF MAKING INTEGRATED CIRCUITS WITH TUB-TIES

This is a divisional of application Ser. No. 09/085,913, filed on May 28, 1998 now U.S. Pat. No. 5,949,112.

FIELD OF THE INVENTION

This invention relates generally to integrated circuits (ICs) and, more particularly, to a process and design for making tub-ties in ICs.

BACKGROUND OF THE INVENTION

In conventional CMOS (complementary metal oxide semiconductor) technology NMOS transistors are embedded in a p-type tub, and, conversely, PMOS transistors are embedded in an n-type tub. Each tub serves to isolate the transistors therein from the bulk substrate and from transistors in the other tub. However, the tubs should not be left floating; i.e., they should be connected to either $V_{cc}$ or to ground in order to prevent latch-up. For this purpose special conducting paths, known as tub-ties, establish ohmic connections between appropriate metal layers (the tub-tie contacts) and each of the tubs. Not every transistor needs a tub-tie, but every tub needs at least one tub-tie. Typically, the area of a tub-tie at the surface of the semiconductor is relatively small, measuring only about 1 $\mu$m×1 $\mu$m. In LOCOS (local oxidation of silicon) isolation of the tub-tie is formed in zones of silicon located between regions of isolating field oxide (FOX), whereas in STI (shallow trench isolation) it is formed in small pillars of silicon disposed between isolating oxide-filled trenches.

In standard CMOS front-end processing (i.e., processing up to but not including metalization), which usually entails about ten different photolithographic mask steps to fabricate the transistors, the source/drain (S/D) regions are typically doped heavily, whereas the tubs are only lightly doped. The tub-tie regions are also heavily doped, usually during the same ion implantation step that dopes the S/D regions. Doping of the n-type tub-tie region of the PMOS transistors, for example, is accomplished by opening a hole over the tub-tie location in the photoresist (PR) mask that protects the PMOS transistor locations during the n-type ion implantation of the S/D regions of the NMOS transistors. Conversely, doping of the p-type tub-tie region of the NMOS transistors is accomplished by opening a hole over the tub-tie location in the PR mask that protects the NMOS transistor locations during the p-type ion implantation of the S/D regions of the PMOS transistors.

However, IC fabrication processes which require a large number of PR mask steps are undesirable, in general implying lower yields and higher cost than processes which utilize fewer PR mask steps. Consequently, workers in the IC art have endeavored to reduce the number of PR mask steps required. See, for example, T. Horiuchi, U.S. Pat. No. 5,571,745 issued on Nov. 5, 1996, U. Schwalke et al., *European Solid-State Device Research Conference*, Conf. Proc., pp. 317–320 (1996), and U. Schwalke et al, *Symposium On VLSI Technology*, Digest of Technical Papers, pp.71–73 (1997). While the various prior art implementations differ, they all accomplish PR mask reduction by combining two or more implant steps, such as tub implants with gate implants. The most aggressive approach, which entails the largest cost reduction, combines all implants into a single PR mask step. However, in so doing the PR mask previously utilized to allow selective doping of the tub-tie regions is no longer available. Thus, a need remains in the art for a reduced-mask-count IC process that enables tub-tie regions to be formed.

SUMMARY OF THE INVENTION

In accordance with one aspect of our invention, an IC comprises a tub of a first conductivity type, at least one transistor embedded in the tub, and a first pair of isolating regions defining therebetween a tub-tie region coupled to the tub. The tub-tie region comprises a cap portion of the first conductivity type and an underlying buried pedestal portion of a second conductivity type. At least a top section of the pedestal portion is surrounded by the cap portion so that a conducting path is formed between the cap portion and the tub. In a CMOS IC an n-type tub tie of this design is provided for PMOS transistors in n-type tubs, and a p-type tub-tie of this design is provided for NMOS transistors in p-type tubs. In a preferred embodiment, the cap portion of each tub-tie comprises a relatively heavily doped central section and more lightly doped peripheral sections, both of the same conductivity type.

In accordance with another aspect of our invention, a reduced-mask-count CMOS IC process includes forming the isolating regions so that each has a protrusion which extends over the surface regions where the peripheral sections of the cap portion are to be formed. Then, a combination of ion implantation energies and concentrations, as well as suitable PR masking, in conjunction with the shape of the isolating regions, enables selective doping of the pedestal portion and the cap portion (central and peripheral sections).

Illustratively, the isolating regions are FOX regions formed by a LOCOS process or TOX (trench oxide) regions formed by an STI process.

BRIEF DESCRIPTION OF THE DRAWING

Our invention, together with its various features and advantages, can be readily understood from the following more detailed description taken in conjunction with the accompanying drawing, in which:

FIGS. 1–8 are schematic, cross-sectional views of a CMOS IC at various, sequential stages of its front-end fabrication utilizing a LOCOS process in accordance with one embodiment of our invention;

FIGS. 9–10 are schematic, cross-sectional views of a portion of a CMOS IC depicting a basic design of a tub-tie in accordance with our invention; FIGS. 9A and 9B show a p-type tub-tie at different stages of its fabrication, whereas FIG. 11 is a schematic showing how the curved, tapered ends of LOCOS FOX approximate the protrusion described with reference to FIGS. 9–10.

Figure 5:
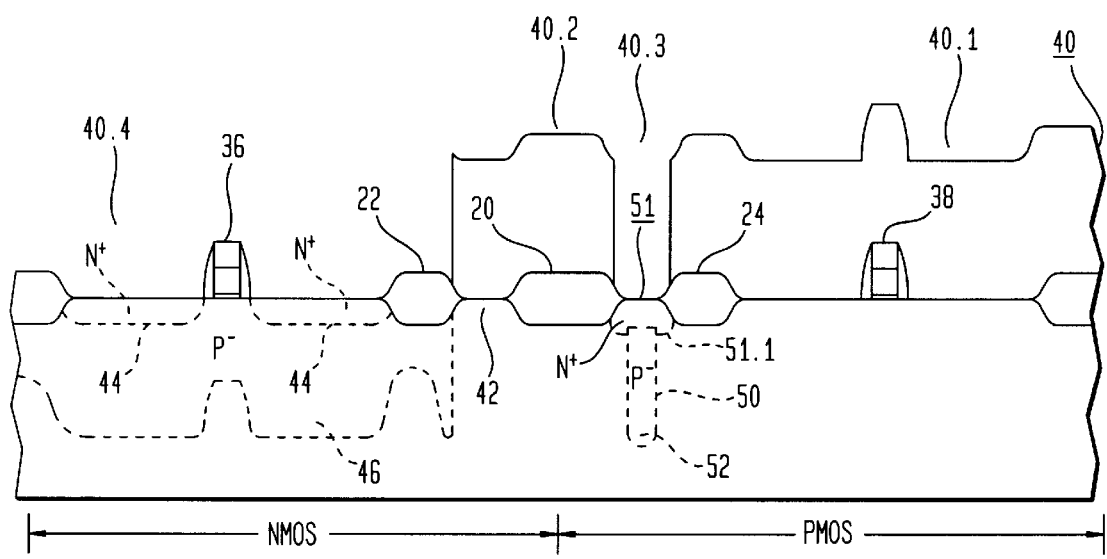
Figure 6:
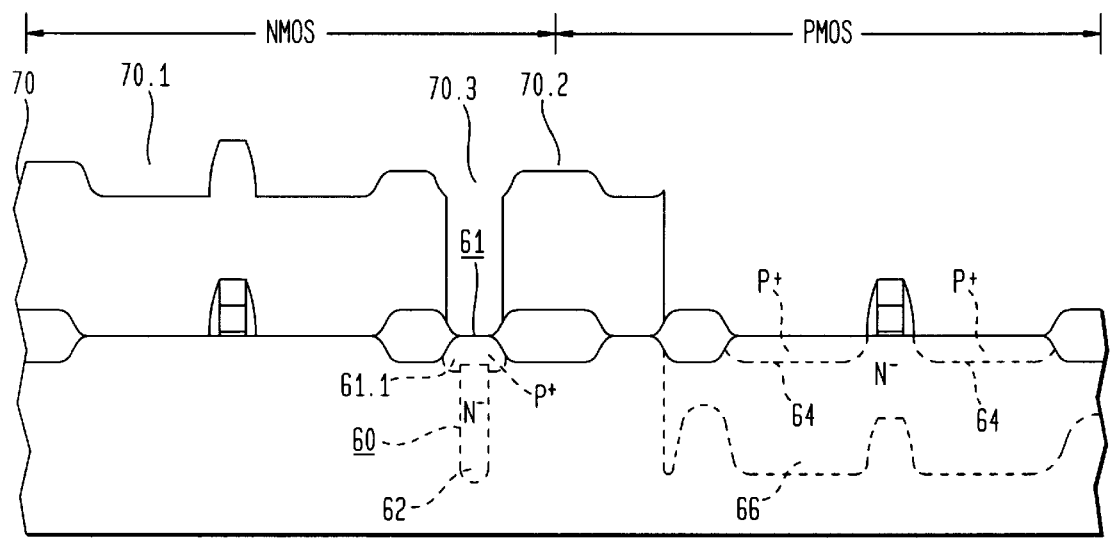

In the interest of clarity and simplicity, these figures are not drawn to scale. Note that the apparent scale of FIGS. 5–6 is larger than that of FIGS. 1–4 but smaller than that of FIGS. 7–8;. In addition, elements in FIGS. 9–10 corresponding to those of FIGS. 1–8 have been given the same reference numbers as in the latter figures but increased by 100.

Moreover, for purposes of clarity only, in the Detailed Description which follows, a double dash is used in the exponents of the conductivity terms n⁻-type and p⁻-type because a single dash is difficult to see. The double dash exponent is intended to designate that the semiconductor is lightly doped, but not necessarily that it is very lightly doped (contrary to the normal usage in the IC art).

DETAILED DESCRIPTION OF THE INVENTION

General Tub-Tie Structure and Fabrication

Figure 9A:
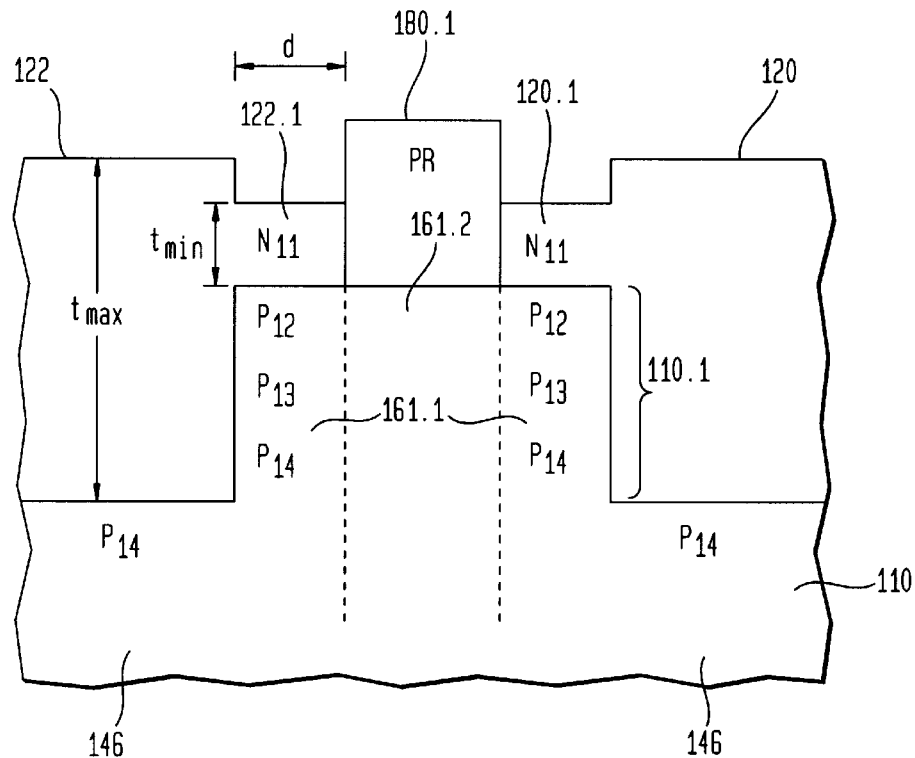
Figure 9B:
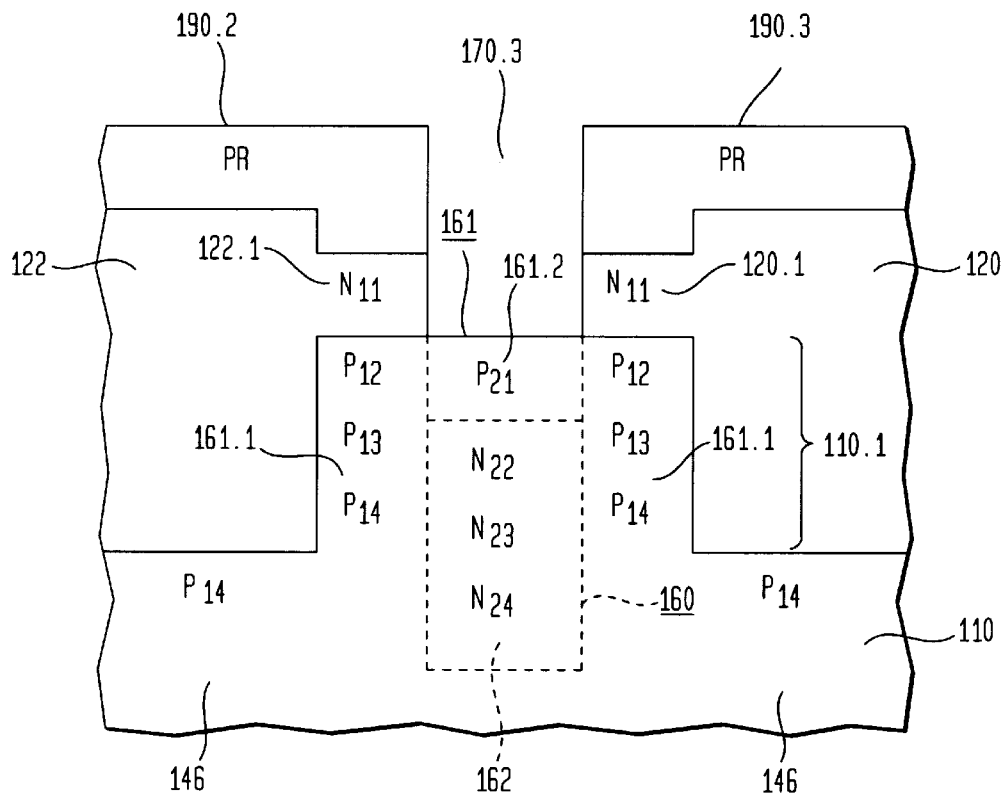

Beginning first with FIG. 9B, we show schematically a p-type tub-tie realized by a reduced-mask-count IC process. The tub itself is designated 146, the tub-tie contact (not shown) would be formed in opening 170.3, and the tub-tie region 160 includes a pedestal portion 162 and a cap portion 161. The latter electrically couples (i.e., ties) the contact to the tub. More specifically, the IC includes a semiconductor body 110 having a raised feature 110.1 in which the tub-tie region is to be formed. The raised feature is bounded by electrically isolating regions 120 and 122 each of which has a protrusion 120.1 and 122.1 respectively, overlaying peripheral sections 161.1 of feature 110.1 and hence of the tub-tie region.

The tub-tie region 160 comprises an n-type buried pedestal portion 162 and a p-type cap portion 161. The cap portion 161 surrounds at least a top section of the pedestal portion 162. Illustratively, the cap portion includes a relatively highly doped central section 161.2 and a more lightly doped peripheral section(s) 161.1, all of which are p-type. In principle, however, only one peripheral section 161.1 is needed to establish electrical connectivity to the tub 146. Thus, even if the left hand peripheral section were n-type, allowing the pedestal portion to pinch-off the conducting path between isolating region 122 and pedestal portion 162, the right hand peripheral section would still provide the needed connectivity between the cap portion 161 and the tub 146. Note, of course, the peripheral sections could be part of a cylindrical structure, in which case the left and right handedness exists only in cross-section.

Figure 10A:
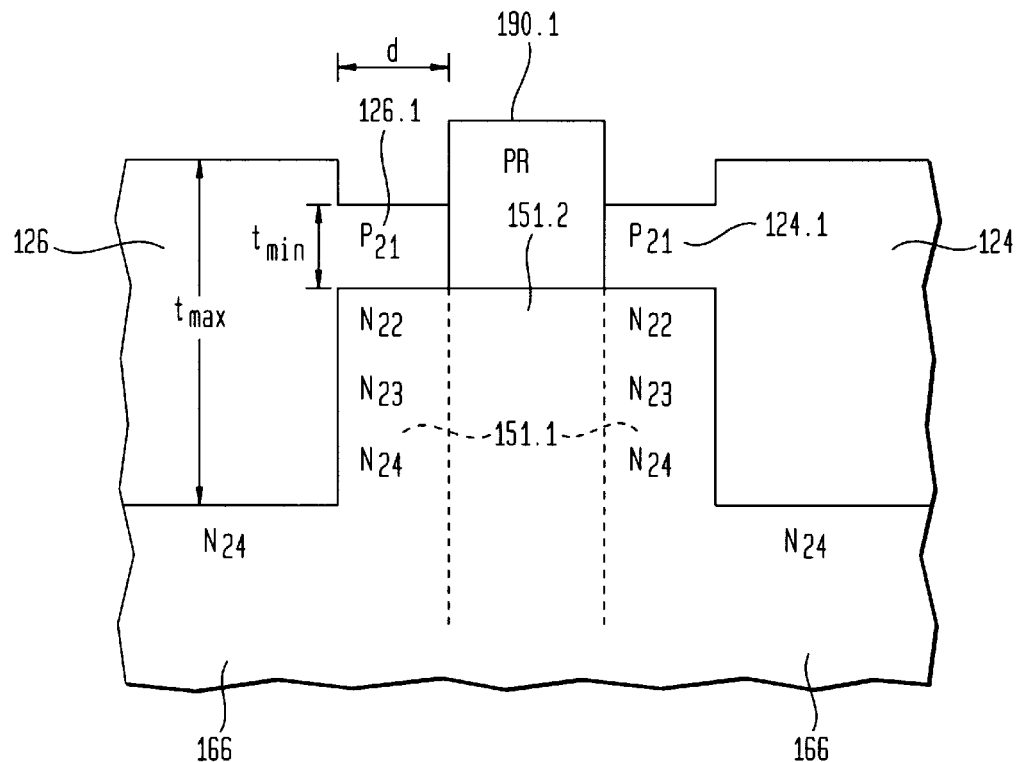
FIGS. 10A and 10B show an n-type tub-tie at the same stages as FIGS. 9A and 9B, respectively.
Figure 10B:
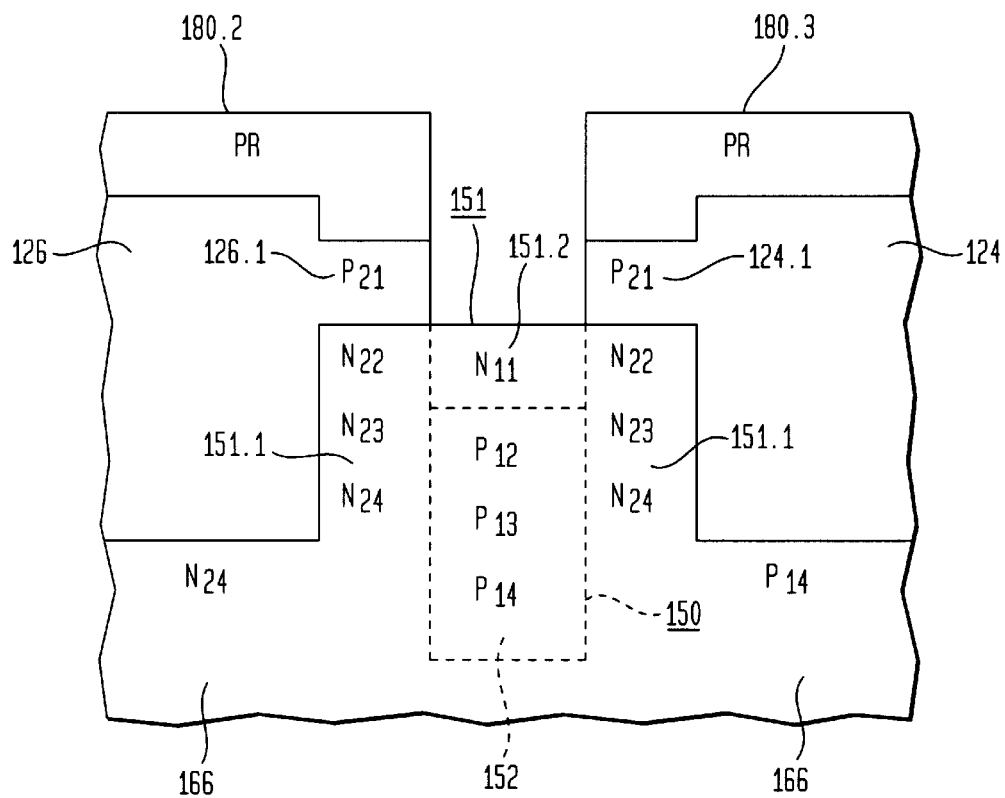

Similarly, FIG. 10B depicts an n-type tub-tie of the same design as the p-type tub-tie of FIG. 9B, except that the conductivity types have been reversed.

The tub-tie structure of FIGS. 9 and 10 can be realized utilizing a variety of IC fabrication processes, such as LOCOS and STI, as will be described more fully hereinafter. However, in general the process exploits the shape of the isolating regions 120, 122, 124 and 126 to selectively dope the raised semiconductor feature 110.1 to produce the desired cap portions 151 and 161. In particular, we control the thickness of the isolating regions in various parts thereof (e.g., in the protrusions 120.1, 122.1, 124.1 and 126.1 to impede penetration of implanted ions of a first conductivity type (e.g., n-type), yet permit penetration of ions of a second conductivity type (e.g., p-type).

In the following discussion, we have adopted a notation $P_{ij}$ (i=1,2; j=1,2,3, . . . ) and $N_{ij}$ (i=1,2;j=1,2,3, . . . ) to indicate that certain regions are either p-type ($P_{ij}$) or n-type ($N_{ij}$), with the subscript i designating first and second fabrication cycles, and the subscript j designating that different regions may have different dopant concentrations and/or may have been implanted with dopants during different steps in the IC fabrication process.

LOCOS illustration

With reference now to FIGS. 1–8, we describe the front-end fabrication of a CMOS IC in which the isolating regions are formed by a LOCOS process. FIG. 1 depicts a first stage in the fabrication of the IC after a number of processing steps have been completed; namely, a pad oxide layer 12 has been grown on a single crystal semiconductor body 10, illustratively a silicon substrate. A silicon nitride (hereinafter nitride) layer 14 is deposited on the pad oxide layer 12. A first PR mask 16, formed on the nitride layer 14, is photolithographically patterned to define an opening 18 which exposes portions of the underlying nitride layer. A pair of PR pillars 16.1 segment the opening 18 into three sections: a central section 18.1 where a central isolating region (i.e., FOX region 20, FIG. 3) will be formed, and a pair of lateral sections 18.2 where lateral isolating regions (i.e., FOX regions 22 and 24, FIG. 3) will also be formed. Next, the nitride layer is etched (e.g., by a RIE process), and the PR is removed leaving two nitride pillars 14.1 as shown in FIG. 2. Ultimately, tub-tie regions will be formed in the regions of the substrate under the nitride pillars 14.1. Now, the FOX regions 20, 22 and 24 are thermally grown in the areas of the substrate surface not covered by the patterned nitride layer. After FOX growth is completed, the pad oxide layer 12 and the remaining portions of the nitride layer are removed as shown in FIG. 3.

Next, the formation of the gate structures of the NMOS and PMOS transistors are begun by the sequential formation of a multiplicity of layers not shown: a gate oxide layer, a polycrystalline silicon layer, and other layers (not shown, but well known in the art) which may be used to facilitate processing. A second PR mask is photolithographically patterned to form two resist pillars over the regions where the gate stacks 32 and 36 (FIG. 4) are to be formed. Then, the layers of the gate stack are sequentially etched, and the resist pillars are removed, leaving the pair of gate stacks 32 and 36. At this stage, each gate stack comprises a gate oxide layer on the substrate, a polycrystalline layer on the gate oxide layer and, as above, other layers (not shown, but well known in the art) which may be used to facilitate processing. Then, optional silicon dioxide spacers are formed on the sides of the gate stacks. The resulting intermediate structure of the IC is shown in FIG. 4 where the spacers are designated by reference numeral 34 and 38, the gate stacks by numerals 32 and 36, and the gate oxide by numeral 30.

At this stage a well-known screen oxide layer (not shown) could be formed over the structure in order to protect exposed portions of the substrate during subsequent ion implantation steps.

Note, to this point in the front-end process sequence only two PR masks have been utilized and no ion implantation steps have been performed. In fact, as the following description will demonstrate only two more PR masks are required to complete the front-end of the IC, and, during each of two implantation cycles, all of the ion implantation steps are sequentially performed with no intervening photolithography step. More specifically, FIG. 5 shows that a third PR mask 40 is formed on the top surface of the intermediate structure of FIG. 4. The mask is photolithographically patterned so as to expose the locations 40.4 where the NMOS transistors are to be formed and the location 40.3 where the tub-tie to the n-type tub is to be formed. However, the locations of the PMOS transistors and the tub-tie to the p-type tub remain masked. At this stage all of the desired ion implants for the NMOS transistors and some of the implants for the n-type tub-tie are performed, without intervening photolithographic mask steps. These implantation steps may include one or more of the following illustrative implants: tub implants, isolation implants, threshold implants, LDD/ extension implants, MDD implants, S/D implants, and polysilicon gate implants. From the perspective of forming the tub-tie regions, however, the S/D implants also form the more heavily doped central sections 51.2 (FIG. 7) of the cap portions 51, whereas the other implants form the more lightly doped peripheral sections 51.1 of the cap portions 51, and the more lightly doped buried pedestal portions 52.

Figure 7:
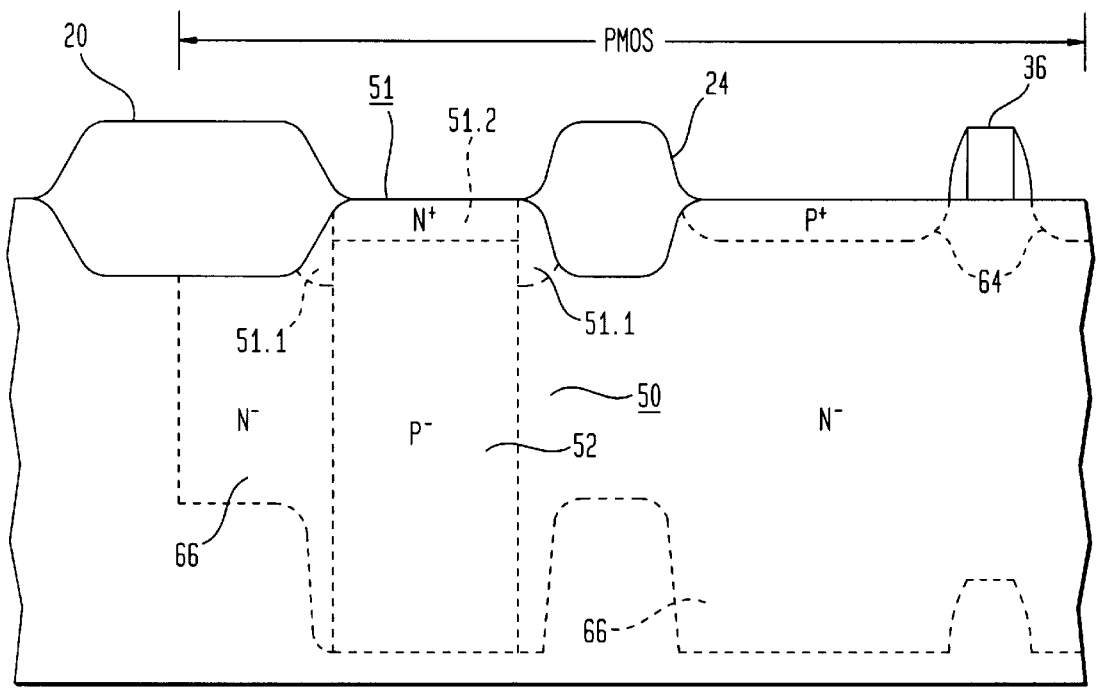

More, specifically the relatively shallow S/D implants form the n⁺type S/D regions 44 of the NMOS transistors (FIGS. 5 and 8) and the n⁺-type central section 51.2 of the cap portion 51 of the tub-tie region 50 (FIGS. 5 and 7). On the other hand, the deeper implants (e.g., tub implant, valley-fill implant etc.) form the p⁻-type tub 46 of the NMOS transistors and the p⁻-type buried pedestal portion 52 of the tub-tie region 50. Significantly, as shown in FIG. 7, the pedestal portion 52 does not intersect the adjacent FOX regions 20 and 24; i.e., at least a top section of the pedestal portion 52 is surrounded by the cap portion 51, so that at least one n⁻-type peripheral section 51.1 forms a conducting path between the n⁺-type central section 51.2 of cap portion 51 and the n⁻-type tub 66. Illustratively, two such peripheral sections 51.1 are formed as shown in FIGS. 5 and 7. For simplicity the ohmic metal contact to the cap portion has been omitted. It is this contact that would be connected to $V_{cc}$ or ground, as is well known in the art.

As described earlier with reference to FIGS. 9–11 the peripheral section 51.1 between the pedestal 52 and the FOX regions 20 and 24 is realized by exploiting the shape of the FOX regions in conjunction with suitable PR masks and by controlling the ion implantation energies of the dopants so that, in the peripheral sections 51.1, the n⁻-type dopant penetrates the FOX sufficiently to form a conducting path between the n⁺-type central section 51.2 and n⁻-type tub 66, while the p⁺type S/D implant is a wholly absorbed (or nearly so) by the curved section of the FOX. In contrast, in the pedestal portion 52, the p⁻-type dopant penetrates deeper into the semiconductor than the n⁺-type dopant in the central section 51.2, thereby forming a buried p⁻-type pedestal portion 52 below the n⁺-type central section 51.2 of the cap portion. In addition, the dopant concentrations are controlled so that the n⁺-type concentration in the central section 51.2 is much higher than that of the p⁻-type dopant in the pedestal portion 52; i.e., in the central section 51.2, where the two dopant species overlap, the n⁺-type dopant will be predominant because the p⁺-type dopant will not compensate the n⁻type dopant to any significant extent. Thus, the central section 51.2 of the cap portion forms an essentially ohmic contact with the metal tub-tie contact layer (not shown) thereto.

Figure 8:
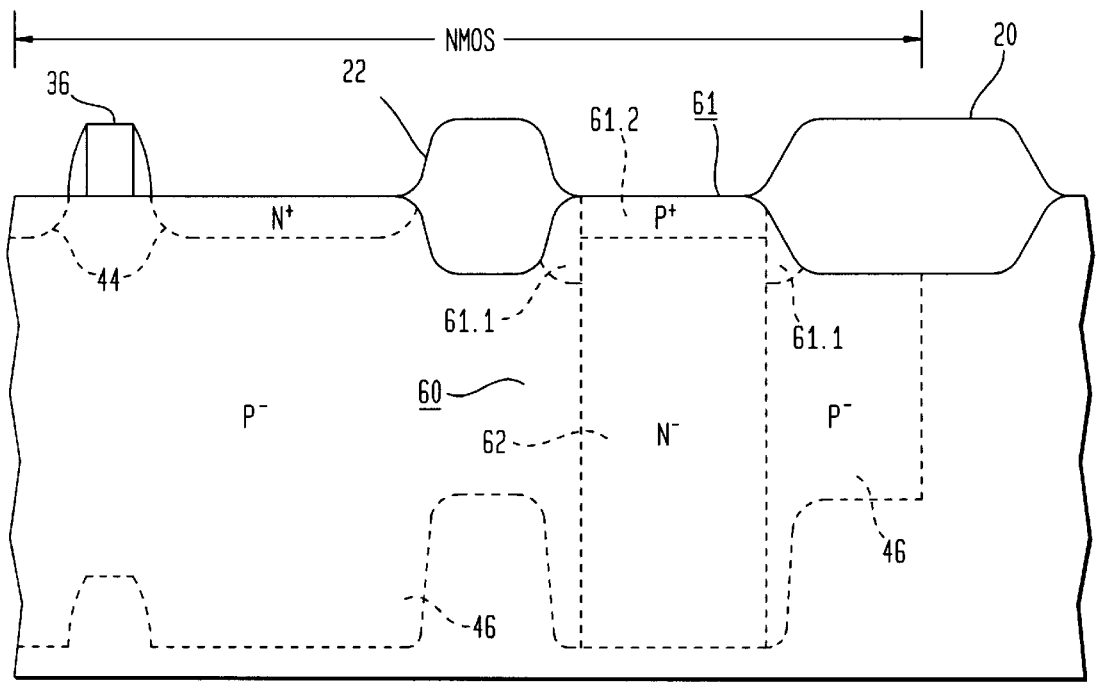

After these implantation steps are completed, the remaining portions of the third PR mask 40 are removed. Then, as shown in FIGS. 6 and 8, a fourth PR mask 70 is patterned on the structure in order to form the PMOS transistors and the tub-tie 60 to the p-type tub 46. The basic process described above is repeated, but with the conductivity types of the various dopant species reversed as would be well known in the art. In the interest of brevity, the details will not be repeated here. Instead, reference will be made to the desired result: i.e., the PMOS transistors are formed as shown in FIG. 6, and the tub tie region 60 to the p-type tub 46 as shown in FIG. 8. As before, the tub-tie 60 comprises a p⁺-type cap portion 61 which surrounds at least a top section of an n⁻-type pedestal portion 62. The cap portion includes a p⁺-type central section 61.2 and p⁻-type peripheral sections 61.1 that establish a conducting path between the central section 61.2 of the cap portion 61 and the p⁻-type tub 46. Again, the ohmic contact to the cap portion is not shown.

Of course, the sequence of forming the transistors is not critical; i.e.. the PMOS transistors can be formed first rather than last, and conversely for the NMOS transistors.

In summary, it is apparent from the foregoing that the embodiments described require only four photolithography steps in contrast with ten such steps typical of standard CMOS IC front-end processing. Yet, the making of tub-ties is realized even though a reduced-mask-count IC fabrication process is employed.

It is to be understood that the above-described arrangements are merely illustrative of the many possible specific embodiments which can be devised to represent application of the principles of the invention. Numerous and varied other arrangements can be devised in accordance with these principles by those skilled in the art without departing from the spirit and scope of the invention.

What is claimed is:

1. A process for making a CMOS IC including a p-type tub tie region having a p-type cap portion and an n-type pedestal portion and an n-type tub tie region having an n-type cap portion and an p-type pedestal portion, each of said cap portions having a central section and peripheral sections with the former more heavily doped than the latter, said process comprising:

forming a multiplicity of separate isolating regions in the surface of a semiconductor body, the spaces between some isolating regions defining the location of PMOS or NMOS transistors and the spaces between other isolating regions defining the locations of said tub-tie regions, each of said isolating regions adjacent a tub-tie having a protrusion which extends partially over the surface of said tub-tie region, thereby defining peripheral sections of said cap portion under said protrusions and a central section therebetween, forming a first mask over the location where the central section of a p-type tub-tie region is to be formed and over the isolating regions, including the protrusions, adjacent the locations where an n-type tub-tie region is to be formed, sequentially performing a first cycle of ion implantation steps without intervening mask steps, said implantation steps including at least (1) implanting n-type dopant to a relatively shallow depth in the S/D regions of the NMOS transistors and simultaneously in the central section of the n-type tub-tie region, said protrusions preventing said n-type dopant from penetrating therethrough into said peripheral sections of said p-type tub-tie region, and (2) implanting p-type dopant to relatively larger depths through said isolating regions, including said protrusions, to form a p-type tub of the NMOS transistors and to dope p-type said peripheral portions of said p-type tub-tie region, and simultaneously to form said p-type buried pedestal portion of said n-type tub-tie region of the PMOS transistors, removing said first mask, forming a second mask over the location where the central section of an n-type tub-tie is to be formed and over the isolating regions, including the protrusions, adjacent the locations where an p-type tub-tie region is to be formed, sequentially performing a second cycle of ion implantation steps without intervening mask steps, said implantation steps including at least (3) implanting p-type dopant to a relatively shallow depth in the SID regions of the PMOS transistors and simultaneously in the central section of the p-type tub-tie region, said protrusions preventing said p-type dopant from penetrating therethrough into said peripheral sections of said n-type tub-tie region, and (4) implanting n-type dopant to relatively larger depths through said isolating regions, including said protrusions, to form an n-type tub of the PMOS transistors and to dope n-type said peripheral portions of said n-type tub-tie region, and simultaneously to form said n-type buried pedestal portion of said p-type tub-tie region of the NMOS transistors, at least a top section of each of said pedestal portions being formed so as to surround the corresponding cap portion so that a conducting path is formed between said cap portion and the corresponding tub of the said transistors.

2. The invention of claim 1 wherein the central sections of said cap portions are doped to a higher carrier concentration than said pedestal portions.

3. The invention of claim 1 wherein said first and second pairs of isolating regions are formed so as to have an isolating region in common with one another.

4. The invention of claim 1 wherein each of said cap portions is wider than said top section of its corresponding pedestal portion, and wherein each of said central sections is more heavily doped than its corresponding pedestal portion and each of said peripheral sections is less heavily doped than its corresponding central section.

5. The invention of claim 1 wherein each of said peripheral sections of said cap portions is formed so that it physically contacts each of the corresponding isolation regions that define the locations of its tub-tie regions.

* * * * *